(12) United States Patent
Sadoughi et al.

(10) Patent No.: US 8,302,064 B1
(45) Date of Patent: Oct. 30, 2012

(54) METHOD OF PRODUCT PERFORMANCE IMPROVEMENT BY SELECTIVE FEATURE SIZING OF SEMICONDUCTOR DEVICES

(75) Inventors: Sharmin Sadoughi, Menlo Park, CA (US); Prabhuram Gopalan, Milpitas, CA (US); Michael J. Hart, Palo Alto, CA (US); John Cooksey, Brentwood, CA (US); Zhiyuan Wu, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 471 days.

(21) Appl. No.: 12/401,450

(22) Filed: Mar. 10, 2009

(51) Int. Cl.
*G06F 9/455* (2006.01)
*G06F 17/50* (2006.01)

(52) U.S. Cl. .................. 716/133; 716/119; 716/132

(58) Field of Classification Search ............ 716/133
See application file for complete search history.

(56) References Cited

U.S. PATENT DOCUMENTS

| | | | | |
|---|---|---|---|---|
| 6,148,434 | A * | 11/2000 | Nozuyama | 716/108 |
| 6,449,756 | B1 * | 9/2002 | Malik et al. | 716/113 |
| 7,089,515 | B2 * | 8/2006 | Hanafi et al. | 716/136 |
| 2008/0040698 | A1 * | 2/2008 | Ferrari et al. | 716/6 |

OTHER PUBLICATIONS

Qi, Xianing; Lo, Sam; Gyure, Alex; Luo, Yansheng; Shahram, Mahmoud; Singhal, Kishore; Macmillen, Don; "Efficient Subthreshold Leakage Current Optimization," Sep. 2006, IEEE Circuits and Devices Magazine.*

* cited by examiner

*Primary Examiner* — Vuthe Siek
*Assistant Examiner* — Eric Lee
(74) *Attorney, Agent, or Firm* — Michael T. Wallace; LeRoy D. Maunu

(57) ABSTRACT

Device features, such as gate lengths and channel widths, are selectively altered by first identifying those devices within a semiconductor die that exhibit physical attributes, e.g., leakage current and threshold voltage magnitude, that are different than previously verified by a design/simulation tool used to design the devices. The identified, non-conforming devices are then further identified by the amount of deviation from the original design goal that is exhibited by each non-conforming device. The non-conforming devices are then mathematically categorized into bins, where each bin is tagged with a magnitude of deviation from a design goal. The mask layers defining the features of the non-conforming devices are then selectively modified by an amount that is commensurate with the tagged deviation. The selectively modified mask layers are then used to generate a new semiconductor die that exhibits improved performance.

16 Claims, 5 Drawing Sheets

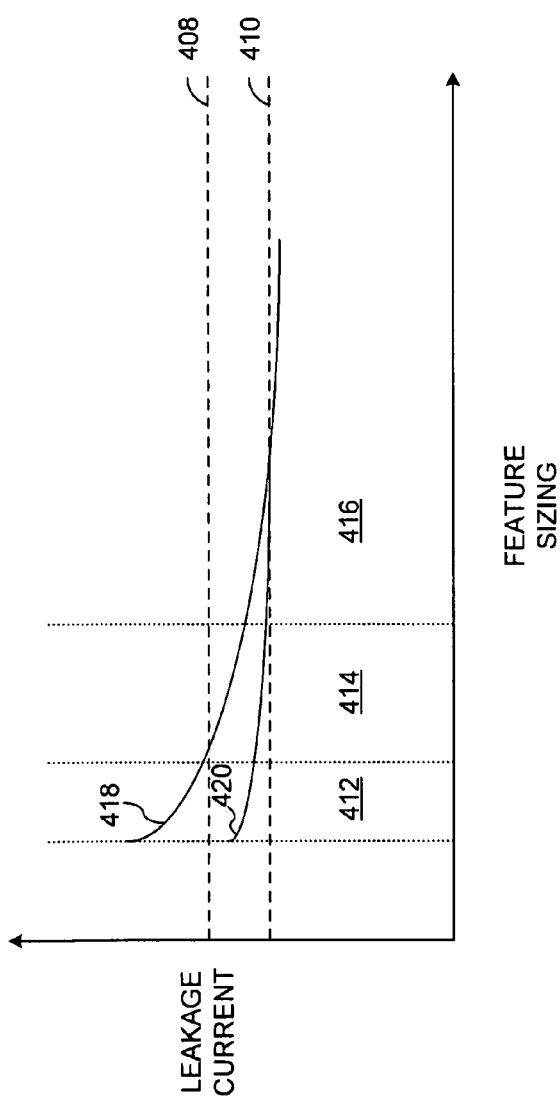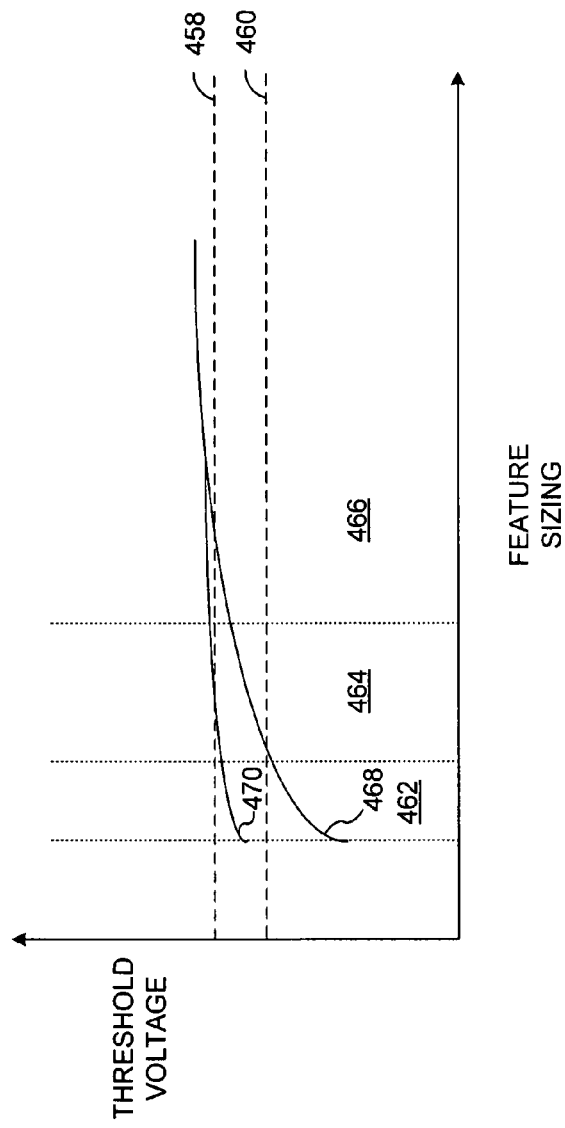

METHOD OF PRODUCT PERFORMANCE IMPROVEMENT BY SELECTIVE FEATURE SIZING OF SEMICONDUCTOR DEVICES

FIELD OF THE INVENTION

The present invention generally relates to integrated circuits, and more particularly to selective feature sizing within the integrated circuits to obtain product performance improvement.

BACKGROUND OF THE INVENTION

Advances in the field of semiconductor integrated circuits (ICs) have brought about higher levels of integration. Accordingly, semiconductor manufacturing process advancements are driving the corresponding geometric dimensions of semiconductor devices to decreasingly smaller values. 10 micrometer (μm) gate lengths, for example, were common in the 1970's, but continuously advancing semiconductor manufacturing processes have reduced gate lengths to well below 100 nanometers (nm) for deep sub-micron integrated circuit (IC) design.

One key challenge presented by deep sub-micron design is the adjustment of the various semiconductor processing steps required to implement devices within a silicon die so as to obtain acceptable yield and manufacturability. Such process adjustments, however, may lead to significant performance deviations between simulated devices that are designed and characterized within a design/simulation environment and the corresponding physical devices that are implemented within a semiconductor die.

Operating parameters, such as transistor threshold voltage, leakage current, and saturation current, for example, may be so affected by the process variations that performance of the devices no longer corresponds to design specifications previously verified within the design/simulation environment. As a result, process variations that optimize yield and manufacturability may also contribute to detrimental effects on device performance, such as increased leakage current, reduced threshold voltage, and/or increased saturation current.

As geometric features of the deep sub-micron devices continue to shrink, scaling, implant, and annealing process variations invoke increasingly significant device performance degradations. Reducing the effects of such process-based performance variation has conventionally been implemented either by specifically designing the semiconductor processing steps to minimize process-induced performance degradation, or by changing the equipment used during one or more of the semiconductor processing steps.

Equipment changes utilized to reduce semiconductor device variability during semiconductor processing include, for example, the switch from batch to serial high-current implanters and the switch from radiative to conductive rapid thermal processing. Devices exhibiting 45 nm gate lengths will likely further require a switch to iso-scan, medium current implanters and milli-second annealing processes. Mitigation of process-based, performance variation, however, is often cost prohibitive because such mitigation efforts involve substantial time and money investments before any benefits may be obtained.

SUMMARY OF THE INVENTION

Disclosed here is a method of improving integrated circuit performance by selective feature sizing of semiconductor devices. Embodiments of the present invention provide alternative solutions that mitigate the effects of device variability during semiconductor processing that are not cost prohibitive and that provide substantially equivalent, if not superior, results as compared to conventional techniques. Various embodiments of the present invention disclose a method to compensate for process-induced performance variations within semiconductor dice.

In accordance with one embodiment of the invention, a method of obtaining performance improvement by selective feature sizing of devices contained within a semiconductor die comprises collecting performance metrics of devices contained within the semiconductor die, categorizing each device into bins in response to the collected performance metrics, tagging each bin with a sizing adjustment, and selectively altering feature sizes of each device categorized in each bin in accordance with the tagged sizing adjustment for each bin. The feature sizes are selectively altered by modifying one or more mask layers that define the feature sizes of devices categorized within the bins that are tagged with non-zero sizing adjustments.

In accordance with another embodiment of the invention, a design and simulation system comprises a processor that is adapted to obtain performance improvement within an integrated circuit by selectively altering device features within the integrated circuit. The processor performs functions that include collecting performance metrics of the devices contained within the integrated circuit, categorizing each device into bins in response to the collected performance metrics, tagging each bin with a sizing adjustment, and selectively altering feature sizes of each device categorized in each bin in accordance with the tagged sizing adjustment for each bin. The feature sizes are selectively altered by modifying one or more mask layers that define the feature sizes of devices categorized within the bins that are tagged with non-zero sizing adjustments.

In accordance with another embodiment of the invention, a method of obtaining performance improvement within an integrated circuit by selective feature sizing of semiconductor devices contained within the integrated circuit comprises implementing a first integrated circuit and categorizing each semiconductor device contained within the first integrated circuit into a plurality of bins. Each bin is tagged with a sizing adjustment that is necessary to bring each semiconductor device categorized within the bin into conformance with an acceptable performance level. The method further comprises selectively altering mask layers that define feature sizes of each semiconductor device categorized in each of the plurality of bins in accordance with the tagged sizing adjustment of each bin.

BRIEF DESCRIPTION OF THE DRAWINGS

Various aspects and advantages of the invention will become apparent upon review of the following detailed description and upon reference to the drawings in which:

FIG. 4 illustrates graphical representations of performance improvements obtained by the bin processing of the devices of FIG. 3 in accordance with alternate embodiments of the present invention.

DETAILED DESCRIPTION

Figure 1:
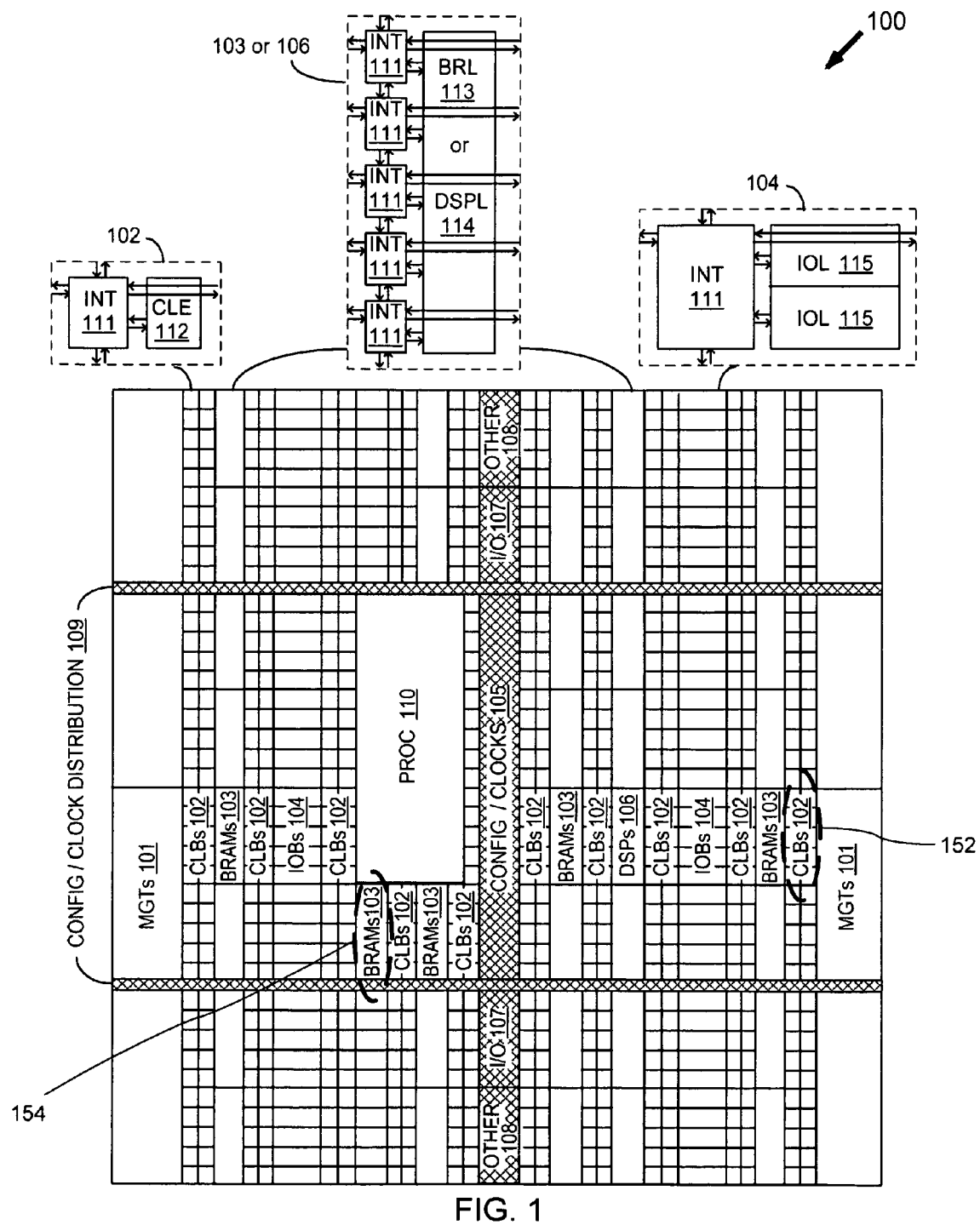
FIG. 1 illustrates an exemplary Field Programmable Gate Array (FPGA) architecture that may be affected by process-based performance variation.

Generally, various embodiments of the present invention provide selective resizing of semiconductor features that exhibit process-induced variation between the semiconductor features designed and characterized within a design/simulation environment and the semiconductor features that are physically implemented within a semiconductor die. In particular, a design/simulation tool may be utilized to design semiconductor devices within an integrated circuit (IC), so that the collective set of semiconductor devices within the IC achieve a particular design goal. Commitment of the IC design for layout and implementation within a physical semiconductor die, however, may change the design as previously characterized, since semiconductor processing techniques used to optimize yield and manufacturability may adversely affect semiconductor device performance by changing physical characteristics of the semiconductor devices.

Device features, such as gate lengths for example, of respective field effect transistors (FETs) contained within the IC may be subjected to excessive shrinkage due to yield-optimized, or manufacturability-optimized, semiconductor processing. As a result, adverse effects, such as increased leakage current or decreased threshold voltage, may be exhibited by the FET due to the gate length shrinkage. Furthermore, gate length shrinkage may not necessarily be uniformly manifested across the IC, or may exhibit non-uniform variation due to other parameters. As a result, gate lengths of FETs implemented within one geographic region of the IC may be affected differently as compared to gate lengths of FETs that are implemented within other geographic regions within the IC. Accordingly, leakage current and threshold voltage magnitudes may be different depending upon the specific geographic region or other attributes relating to the physical layout of the IC.

Other device features, such as channel widths of respective FETs implemented within the IC, may also be subjected to variation due to yield-optimized, or manufacturability-optimized, semiconductor processing. As a result, adverse effects, such as increased leakage current or decreased threshold voltage, may be exhibited by the FET due to the channel width shrinkage. Furthermore, channel width shrinkage may not necessarily be uniformly manifested across the IC, or may exhibit non-uniform variation due to other parameters. As a result, channel widths of FETs implemented within one geographic region of the IC may be affected differently as compared to channel widths of FETs that are implemented within other geographic regions within the IC. Accordingly, leakage current and threshold voltage magnitudes may be different depending upon the specific geographic region or other attributes relating to the physical layout of the IC.

In one embodiment, therefore, the present invention provides identification of those devices within the semiconductor die that exhibit physical attributes, e.g., leakage current and threshold voltage magnitude, that are different than previously verified by the design/simulation tool used to design the devices. In other words, the present invention identifies physical devices within a semiconductor die that exhibit performance parameters that do not conform to designed performance parameters. The identified, non-conforming devices are then further identified by the amount of deviation from the original design goal that is exhibited by the non-conforming devices. The non-conforming devices are then mathematically categorized into bins, where each bin is defined by an amount, or range, of deviation from design goal exhibited by the constituent devices of the bin.

For example, the leakage current of a particular set of FETs within a semiconductor die may be designed to be equal to a design goal for leakage current. Due to process-based variations, however, the leakage current of non-conforming FETs may instead exceed the design goal for leakage current. In such an instance, a first set of bins may be mathematically generated whose constituents include those non-conforming devices exhibiting excessive leakage current magnitudes. Once mathematically categorized into bins, each bin is then tagged with a sizing adjustment that is required in order to bring the non-conforming devices that are categorized within each bin into conformance with the design goal.

A first bin of non-conforming devices exhibiting excessive leakage current magnitudes may, therefore, be tagged with a sizing adjustment of X nm, whereby, e.g., the gate lengths and/or channel widths, of the non-conforming devices categorized within the first bin are extended by X nm in order to decrease the leakage current magnitude of each device within the first bin to meet the design leakage current goal. Similarly, a second bin of moderately non-conforming devices exhibiting moderate leakage current magnitudes may be tagged with a sizing adjustment of Y nm, whereby, e.g., the gate lengths and/or channel widths, of the non-conforming devices categorized within the second bin are extended by Y nm in order to decrease the leakage current magnitude of each device within the second bin to meet the design leakage current goal. The bin of minimally non-conforming devices exhibiting minimally non-conforming leakage current magnitudes may be similarly tagged with a sizing adjustment of Z nm, whereby, e.g., the gate lengths and/or channel widths, of the non-conforming devices categorized within the third bin are extended by Z nm in order to decrease the leakage current magnitude of each device within the third bin to meet the design leakage current goal.

It can be seen, therefore, that $X>Y>Z$ because the sizing adjustment required to bring a device exhibiting an excessive leakage current magnitude requires a greater extension of, e.g., gate length and/or channel width, than does a device exhibiting a moderately non-conforming leakage current magnitude. Similarly, a device exhibiting a moderately non-conforming leakage current magnitude requires a greater extension of, e.g., gate length and/or channel width, than does a device exhibiting a minimally non-conforming leakage current magnitude.

In order to implement the sizing adjustment, the masking layer(s) that define the gate length and/or channel width of the devices categorized within each bin may be selectively altered in accordance with the sizing adjustment tags for each bin. As such, the non-conforming devices are selectively resized in accordance with their respective deviation from design goal. A new semiconductor die may then be generated from the selectively altered masking layer(s), which is then effective to produce a physical semiconductor die that operates within specified design goals.

Turning to FIG. 1, a field programmable gate array (FPGA) architecture 100 is illustrated that includes a plurality of programmable logic tiles, where each of the plurality of programmable logic tiles are implemented within a semiconductor die that include a number of devices that through process-based variation(s) may exhibit non-conforming performance. The programmable logic tiles of FPGA architecture 100 may include multigigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element (DSPL 114) in addition to an appropriate number of programmable interconnect elements. An 10B 104 can include, for example, two instances of an input/output logic element (IOL 115) in addition to one instance of the programmable interconnect element (INT 111). As will be clear to those of skill in the art, the actual I/O pads connected, for example, to the I/O logic element 115 typically are not confined to the area of the input/output logic element 115.

In the pictured embodiment, a columnar area near the center of the die (shown shaded in FIG. 1) is used for configuration memory cells, i.e., the so-called "configuration memory space", clock, and other control logic. Horizontal areas 109 extending from this column are used to distribute the clocks and configuration signals across the breadth of the FPGA. For example, the various phase variants of clock signals generated by the DCMs of the FPGA may be distributed to various user logic regions that may be configured across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. For example, the number of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA, more than one adjacent column of CLBs are typically included wherever the CLBs appear, to facilitate the efficient implementation of user logic, but the number of adjacent CLB columns varies with the overall size of the FPGA.

As can be seen from FIG. 1, various regions of FPGA 100 are dedicated to a specific type of logic block. As such, process variations may manifest themselves differently depending upon the logic type, geographic location, or other physical attributes of each logic block. For example, BRAMs 103 of region 154 may be affected differently as compared to other BRAMs 103 that are located elsewhere within FPGA 100. Alternately, process variations of FPGA 100 may affect user logic that is located within region 152 differently than user logic that is located within other regions of FPGA 100.

Accordingly, the various embodiments of the present invention are provided to selectively alter physical characteristics of the devices implemented with a semiconductor die, so that the collective performance of the devices within the semiconductor die may be brought to within design specifications. The alteration of selected physical features of the devices within a semiconductor die may be realized by the designer at a design/simulation station as exemplified in FIG. 2. Verilog and VHDL represent two of the more popular HDL languages in use today, which may be used to define the structure of a PLD based design. In particular, HDL facilitates a description of the manner in which a design is decomposed into logic regions and further allows a description of the manner in which each logic region of the design is to be interconnected.

Figure 2:
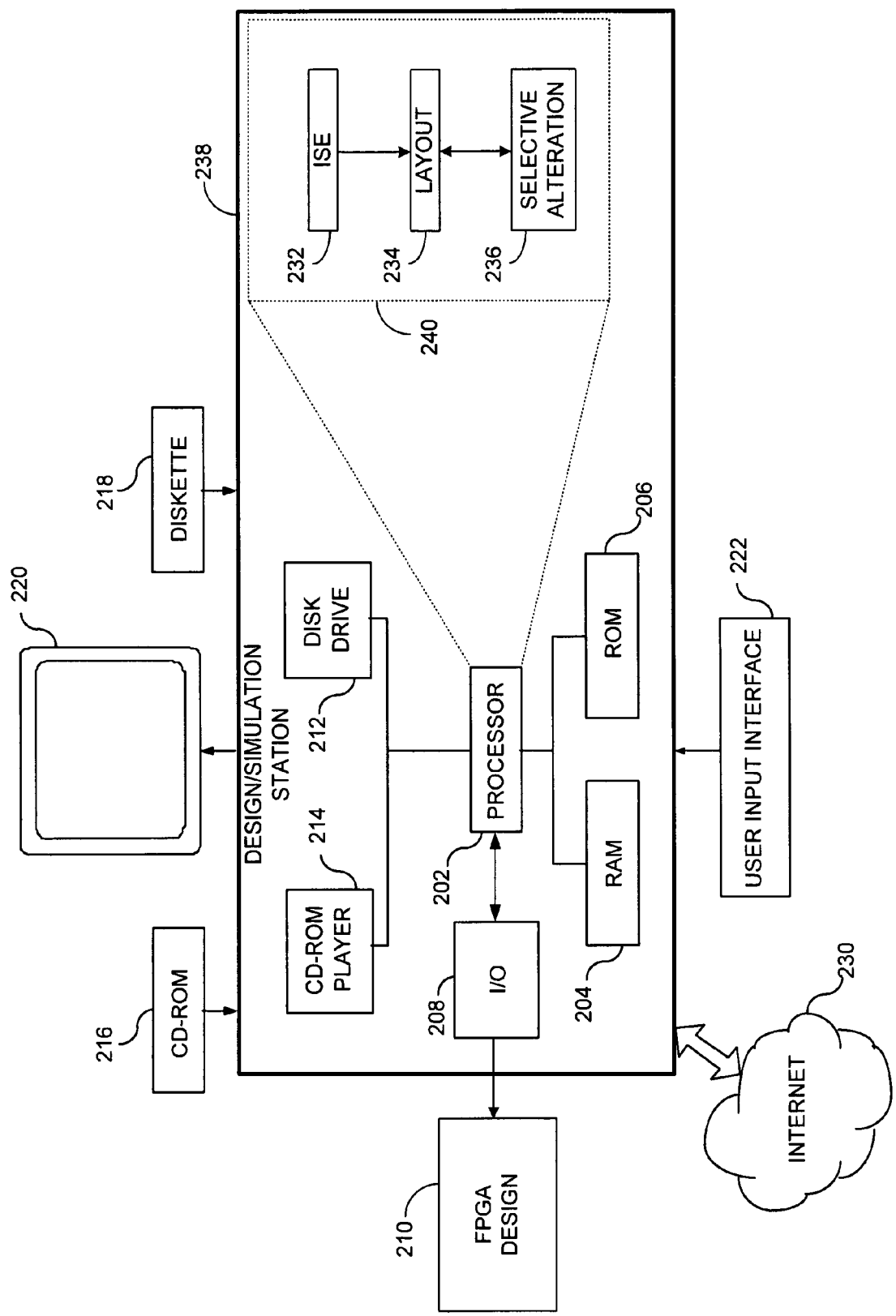
FIG. 2 illustrates a design/simulation station that may be used to design, simulate, and layout each layer of the semiconductor die that is used to implement the FPGA of FIG. 1.

Furthermore, the design/simulation station of FIG. 2 may employ device layout capability, whereby features of the devices defined by the HDL may also be designed and selectively altered at the semiconductor die level. As such, the mask(s) that define the various semiconductor layers of the semiconductor die may also be designed/altered by the design/simulation station of FIG. 2.

The exemplary computing arrangement that is suitable for performing design/simulation activities in accordance with the various embodiments of the present invention includes design/simulation station 238, which includes a central processor (CPU) 202 coupled to random access memory (RAM) 204 and read-only memory (ROM) 206. The ROM 206 may also be other types of storage media to store programs, such as programmable ROM (PROM), electronically erasable PROM (EEPROM), etc. The processor 202 may also communicate with other internal and external components through input/output (I/O) circuitry 208.

Design/simulation station 238 may include one or more data storage devices, including hard and floppy disk drives 212, CD-ROM drives 214, and other hardware capable of reading and/or storing information such as a DVD, etc. Software for facilitating the design and selective alteration of devices in accordance with an embodiment of the present invention may be stored and distributed on a CD-ROM 216, diskette 218 or other form of media capable of portably storing information. These storage media may be inserted into, and read by, devices such as the CD-ROM drive 214, the disk drive 212, etc.

The software for facilitating the design and selective alteration of devices may also be transmitted to design/simulation station 238 via data signals, such as being downloaded electronically via a network, such as Internet 230. Design/simulation station 238 is coupled to a display 220, which may be any type of known display or presentation screen, such as LCD displays, plasma displays, cathode ray tubes (CRT), etc. A user input interface 222 is provided, including one or more user interface mechanisms such as a mouse, keyboard, microphone, touch pad, touch screen, voice-recognition system, etc.

Processor 202 may be used to execute FPGA physical design tools 240 to aid in the minimization and optimization of the equations extracted from the HDL files, as well as the design and selective redesign of device features of FPGA design 210. For example, description/constraint files of integrated software environment (ISE) block 232 may provide, among other definitions, a description of the geographic regions, i.e., sites, within FPGA design 210 that are to be utilized to implement each device of FPGA 210.

Once the design is complete, each layer of the design may be laid out by layout block 234. Layout block 234 may, for example, be utilized to define the mask patterns utilized for each layer of the semiconductor die that implements FPGA design 210. The mask patterns define regions of each layer of the semiconductor die that may be subjected to a variety of subtractive, e.g., etching, or additive, e.g., ion implantation, processes that transfer each mask pattern onto the semiconductor substrate surface.

Once each mask layer is defined by layout block 234, FPGA design 210 may be physically realized onto a semiconductor die and subsequently tested to determine those devices within the semiconductor die that exhibit non-conforming performance attributes. As discussed in more detail below, each non-conforming device may then be mathematically categorized into bins, where each bin defines the physical alteration(s) that are to be performed on each non-conforming device that is categorized within each bin. Selective alteration block 236 may then be employed to implement the defined physical alteration(s) on one or more of the mask layers that define the semiconductor die of FPGA design 210.

Figure 3:
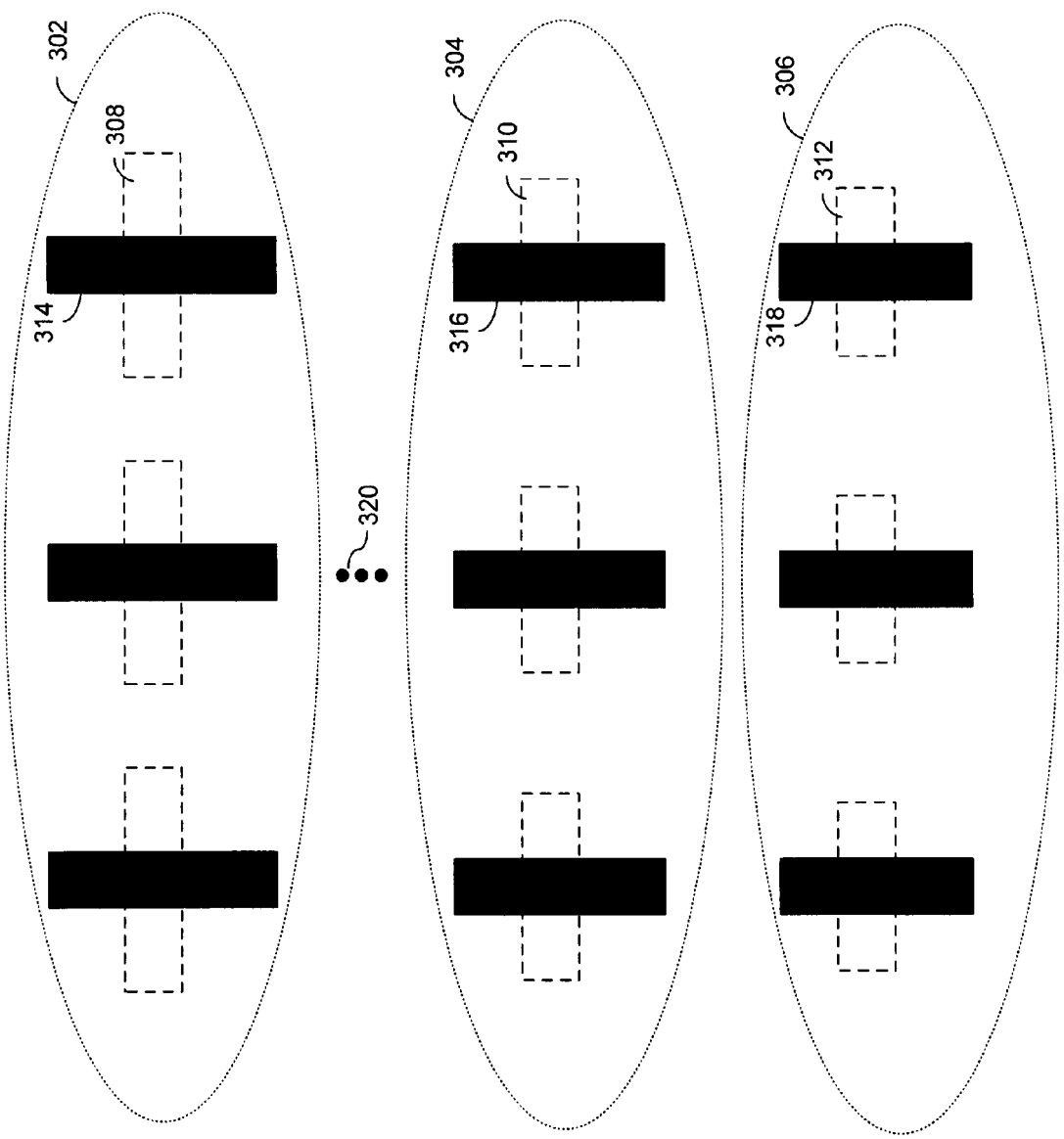
FIG. 3 illustrates bin processing of devices contained within the semiconductor die of the FPGA of FIG. 1 in accordance with one embodiment of the present invention.

Turning to FIG. 3, for example, various devices within the semiconductor die of FPGA 210 are illustrated, where each device may be implemented by utilizing one or more mask layers as defined by layout block 234. In particular, regions 308-312 may represent diffusion regions that are defined by a diffusion mask layer, whereby an additive process, such as ion implantation, is utilized to define source/drain regions and a channel width within each of regions 308-312. Similarly, regions 314-318 may represent polysilicon regions that are defined by a gate mask layer, whereby an additive process, such as chemical vapor deposition (CVD), is utilized to define a polysilicon gate within each of regions 314-318.

As discussed above, design/simulation station 238 may be utilized to design semiconductor devices within the semiconductor die of FPGA 210, so that the collective set of semiconductor devices within the semiconductor die achieve a particular design goal. Commitment of the FPGA design for layout and implementation within a physical semiconductor die, however, may change the design as previously characterized by design/simulation station 238. In particular, semiconductor processing techniques used to optimize yield and manufacturability may adversely affect semiconductor device performance by changing physical characteristics of the semiconductor devices.

Bins 302-306, therefore, represent a mathematical categorization of those devices within the semiconductor die of FPGA 210 that are verified to exhibit physical attributes, e.g., leakage current and threshold voltage magnitude, that either exhibit conforming, or non-conforming, performance as previously verified by design/simulation tool 238. Those devices found to conform to previously verified performance levels are mathematically categorized into bins that are tagged by selective alteration block 236 as not requiring selective alteration.

Those devices, however, that do not conform to previously verified performance levels are then further categorized into bins that are identified by the amount of deviation exhibited by the constituent non-conforming devices. The bin constituency is determined by the amount of performance deviation that is exhibited by each non-conforming device.

For example, the leakage current of a particular set of devices, such as FETs within FPGA 210, may be designed to be equal to, e.g., 100 pA. Due to process-based variations, however, the leakage current of non-conforming FETs may instead range anywhere between, e.g., 120 pA and 500 pA, where leakage current magnitudes between, e.g., 100-119 pA, are considered to be conforming leakage current magnitudes.

In such an instance, a first set of bins, e.g., bins 304-306, may be mathematically generated whose constituents include those non-conforming devices exhibiting leakage current magnitude ranges of, e.g., 120-300 pA and 301-500 pA, respectively. A second set of bins, e.g., bin 302, may be mathematically generated whose constituents include those conforming devices exhibiting a leakage current magnitude range of, e.g., 100-119 pA. It is noted that other bins 320 may also be mathematically generated as required by the categorization algorithm implemented by selective alteration block 236 of FIG. 2. Once mathematically categorized into bins, each bin is then tagged with a sizing adjustment that is required in order to bring each of the respective non-conforming devices into conformance with the original design goal.

For example, bin 306 of non-conforming devices exhibiting a leakage current magnitude range of between 301-500 pA may be tagged with a sizing adjustment of X nm. The gate lengths and/or channel widths as defined within regions 318 and 312, respectively, of the non-conforming devices categorized within bin 306 are extended by X nm in order to decrease the leakage current magnitude of each device categorized within bin 306 to meet the design leakage current goal of 100-109 pA. That is to say, in other words, that the mask layer(s) defining regions 318 and 312 are selectively extended by selective alteration block 236 by X nm so as to adjust the corresponding features of the non-conforming devices of bin 306 to achieve conforming performances.

Similarly, bin 304 of non-conforming devices exhibiting a leakage current magnitude range of 120-300 pA may be tagged with a sizing adjustment of Y nm. The gate lengths and/or channel widths as defined within regions 316 and 310, respectively, of the non-conforming devices categorized within bin 304 are extended by Y nm in order to decrease the leakage current magnitude of each device categorized within bin 304 to meet the design leakage current goal of 100-109 pA. That is to say, in other words, that the mask layer(s) defining regions 316 and 310 are selectively extended by selective alteration block 236 by Y nm so as to adjust the corresponding features of the non-conforming devices of bin 304 to achieve conforming performances.

The bin of conforming devices, e.g., bin 302, exhibiting leakage current magnitudes of 100-109 pA may be similarly tagged with a sizing adjustment of 0 nm. In such an instance, the gate lengths and/or channel widths as defined within regions 314 and 308, respectively, of conforming devices already provide device performances that meet the design leakage current goal of 100-109 pA.

It can be seen, therefore, that the sizing adjustment required to bring the devices categorized within bin 306 is greater than the sizing adjustment that is needed by the devices categorized within bin 304. Thus, each of bins 302-306 are tagged with varying magnitudes of selective alteration that are needed to bring the devices categorized within bins 302-306 into conformance with design goals.

Figure 5:
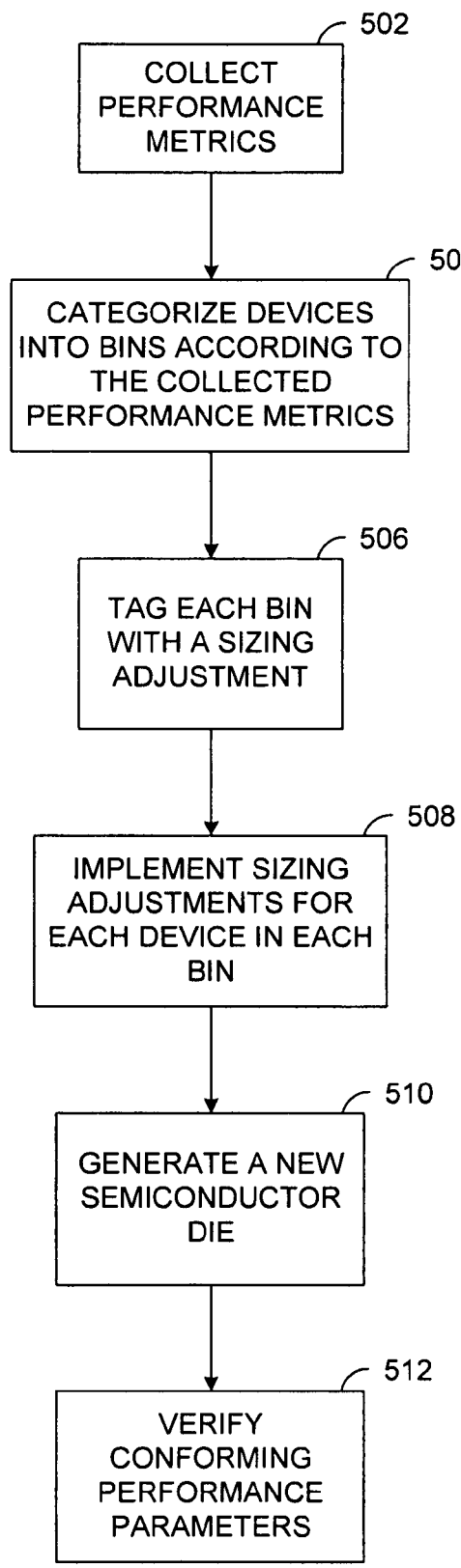
FIG. 5 illustrates a flow diagram of a method of obtaining performance improvement by selective semiconductor feature sizing in accordance with the various embodiments of the present invention.

Turning to FIG. 4A, graphical representations of performance improvements obtained in accordance with one embodiment of the present invention is illustrated. The flow diagram of FIG. 5 is utilized in conjunction with the graphical representations of FIG. 4A, so as to facilitate an explanation of a method of obtaining performance improvement by selective semiconductor feature sizing.

In FIG. 4A, graph 418 plots metrics, e.g., the leakage current exhibited by each device of the semiconductor die, gathered in step 502 from a representative semiconductor die. The metrics are indicative of performance measurements collected from a representative semiconductor die before selective alteration is performed on device features contained within the representative semiconductor die.

In one embodiment, threshold 410 represents a design goal for the magnitude of leakage current that is to be exhibited by each device within the semiconductor die. Threshold 408 represents an upper limit of leakage current magnitude that exceeds design goal threshold 410, but is still acceptable. Thus, those devices exhibiting excessive leakage current magnitudes are categorized within region 412, as in step 504, since the magnitude of leakage current conducted by each device categorized within region 412 exceeds upper threshold 408.

Those devices exhibiting moderately excessive leakage current magnitudes are categorized within region 414, as in step 504, since only a portion of the devices of region 414 exhibit a magnitude of leakage current that exceeds upper threshold 408. Those devices exhibiting acceptable leakage current magnitudes are categorized within region 416, as in step 504, since none of the devices of region 416 exhibit a magnitude of leakage current that exceeds upper threshold 408. It is noted that other devices may be categorized in other regions (not shown), e.g., to the left of region 412, as may be required by the leakage current that is exhibited by those respective devices.

Turning back to FIG. 3, it can be seen that the devices categorized within, e.g., bin 306, may correspond to the devices categorized within, e.g., region 412, since the degradation in performance caused by the process-based variation of the features of devices within bin 306 is maximized. As a result, the magnitude of, e.g., leakage current, that is conducted by the devices within region 412 is maximized.

Similarly, the devices categorized within, e.g., bin 304, may correspond to the devices categorized within region 414, since the process-based variation of the features of devices within bin 304 is not as drastic as the process-based variation of the features of devices contained within bin 306. As a result, the magnitude of, e.g., leakage current, that is conducted by only a portion of the devices contained within region 414 exceeds acceptable threshold 408.

Finally, the devices categorized within, e.g., bin 302, may correspond to the devices categorized within region 416, since the process-based variation of the features of devices within bin 302 is less than the process-based variation of the features of devices contained within bins 304 and 306. As a result, the magnitude of, e.g., leakage current, that is conducted by all of the devices contained within region 416 is acceptable Once each device has been individually categorized into one of bins 306-302 corresponding to regions 412-416, respectively, then each of bins 302-306 is tagged with a sizing adjustment as in step 506. For example, bins 306, 304, and 302 may be tagged in step 506 with sizing adjustments of X nm, Y nm, and Z nm, respectively, as determined by the performance metrics of devices contained within bins 306, 304, and 302 as determined in steps 502-504.

In step 508, sizing adjustments tagged in step 506 are implemented for each device contained within each bin. In one embodiment, the gate lengths of the non-conforming devices categorized within each bin are extended, i.e., increased, by the sizing adjustment that is tagged to each bin in order to decrease the leakage current magnitude of each device categorized within each respective bin. In an alternate embodiment, the channel widths of the non-conforming devices categorized within each bin are extended, i.e., increased, by the sizing adjustment that is tagged to each bin in order to decrease the leakage current magnitude of each device categorized within each respective bin.

That is to say, in other words, that the sizing adjustments tagged in step 506 are implemented by step 508 by selective alteration block 236 of FIG. 2 by altering the mask layer(s) that define the gate and/or diffusion regions of the devices that are to be selectively altered. In particular, the gate lengths and/or channel widths of each device of each bin are selectively extended, i.e., selectively increased, by an amount that is equal to the sizing adjustment tagged to each respective bin.

In step 510, a new semiconductor die is generated using the selectively altered mask layer(s) generated in step 508. In step 512, the conforming performance parameters are verified. In particular, graph 420 plots metrics gathered from the newly generated semiconductor die, e.g., the leakage current exhibited by each device of the newly generated semiconductor die. The metrics are indicative of performance measurements collected from the newly generated semiconductor die after selective alteration is performed on device features contained within the newly generated semiconductor die. It can be seen by inspection, for example, that the leakage current exhibited by each device of the newly generated semiconductor is below acceptable threshold 408, i.e., each device of the newly generated semiconductor die now conforms to the design goal for leakage current.

FIG. 4B represents metrics gathered according to an alternate embodiment of the present invention. In particular, graph 468 plots alternate metrics, e.g., the threshold voltage exhibited by each device of the semiconductor die, gathered in step 502 from a representative semiconductor die. The metrics are indicative of performance measurements collected from a representative semiconductor die before selective alteration is performed on device features contained within the representative semiconductor die.

In one embodiment, threshold 458 represents a design goal for the magnitude of threshold voltage that is to be exhibited by each device within the semiconductor die. Threshold 460 represents a lower limit of threshold voltage that is less than design goal threshold 458, but is still acceptable. Thus, those devices exhibiting excessively deficient threshold voltage are categorized within region 462, as in step 504, since the threshold voltage of each device categorized within region 462 is lower than threshold 460.

Those devices exhibiting moderately deficient threshold voltage are categorized within region 464, as in step 504, since only a portion of the devices of region 464 exhibit a threshold voltage that is lower than threshold 460. Those devices exhibiting acceptable threshold voltage are categorized within region 466, as in step 504, since none of the devices of region 466 exhibit a threshold voltage that is lower than threshold 460. It is noted that other devices may be categorized in other regions (not shown), e.g., to the left of region 462, as may be required by the threshold voltage that is exhibited by those respective devices.

Turning back to FIG. 3, it can be seen that the devices categorized within, e.g., bin 306, may correspond to the devices categorized within, e.g., region 462, since the degradation in performance caused by the process-based variation of the features of devices within bin 306 is maximized. As a result, the magnitude of, e.g., threshold voltage, that is exhibited by the devices within region 462 is minimized.

Similarly, the devices categorized within, e.g., bin 304, may correspond to the devices categorized within region 464, since the process-based variation of the features of devices within bin 304 is not as drastic as the process-based variation of the features of devices contained within bin 306. As a result, the magnitude of, e.g., threshold voltage, that is exhibited by only a portion of the devices contained within region 464 is less than threshold 460.

Finally, the devices categorized within, e.g., bin 302, may correspond to the devices categorized within region 466, since the process-based variation of the features of devices within bin 302 is less than the process-based variation of the features of devices contained within bins 304 and 306. As a result, the magnitude of, e.g., threshold voltage, that is exhibited by all of the devices contained within region 466 is acceptable.

Once each device has been individually categorized into one of bins 306-302 corresponding to regions 462-466, respectively, then each of bins 302-306 is tagged with a sizing adjustment as in step 506. For example, bins 306, 304, and 302 may be tagged in step 506 with sizing adjustments of X nm, Y nm, and Z nm, respectively, as determined by the performance metrics of devices contained within bins 306, 304, and 302 as determined in steps 502-504.

In step 508, sizing adjustments tagged in step 506 are implemented for each device contained within each bin. In one embodiment, the gate lengths of the non-conforming devices categorized within each bin are extended, i.e., increased, by the sizing adjustment that is tagged to each bin in order to increase the threshold voltage of each device categorized within each respective bin. In an alternate embodiment, the channel widths of the non-conforming devices categorized within each bin are extended, i.e., increased, by the sizing adjustment that is tagged to each bin in order to increase the threshold voltage of each device categorized within each respective bin.

That is to say, in other words, that the sizing adjustments tagged in step 506 are implemented by step 508 by selective alteration block 236 of FIG. 2 by altering the mask layer(s) that define the gate and/or diffusion regions of the devices that are to be selectively altered. In particular, the gate lengths and/or channel widths of each device of each bin are selectively extended, i.e., selectively increased, by an amount that is equal to the sizing adjustment tagged to each respective bin.

In step 510, a new semiconductor die is generated using the selectively altered mask layer(s) generated in step 508. In step 512, the conforming performance parameters are verified. In particular, graph 470 plots metrics gathered from the newly generated semiconductor die, e.g., the threshold voltage exhibited by each device of the newly generated semiconductor die. The metrics are indicative of performance measurements collected from the newly generated semiconductor die after selective alteration is performed on device features contained within the newly generated semiconductor die. It can be seen by inspection, for example, that the threshold voltage exhibited by each device of the newly generated semiconductor is above acceptable threshold 460, i.e., each device of the newly generated semiconductor die now conforms to the design goal for threshold voltage.

Other aspects and embodiments of the present invention will be apparent to those skilled in the art from consideration of the specification and practice of the invention disclosed herein. For example, device features other than gate length and channel width may instead be selectively altered to improve performance parameters other than leakage current and voltage threshold. It is intended that the specification and illustrated embodiments be considered as examples only, with a true scope and spirit of the invention being indicated by the following claims.

What is claimed is:

1. A method of obtaining performance improvement by selective feature sizing of devices contained within a semiconductor die, the method comprising:
    collecting performance metrics of devices contained within the semiconductor die, each performance metric being one of a leakage current measurement or a threshold voltage measurement;
    wherein each device has a respective individual performance metric value;
    categorizing each device into one bin of a plurality of bins in response to the collected performance metrics;
    wherein the categorizing includes categorizing all of the devices that have respective individual performance metric values that are within a range of performance metric values into a respective one of the plurality of bins, and the range of the respective individual performance metric values of the devices categorized into each of the plurality of bins does not overlap the range of the respective individual performance metric values of the devices categorized into any other of the plurality of bins;
    tagging each bin with a respective sizing adjustment;
    wherein the plurality of bins includes at least two bins that are tagged with different respective sizing adjustments that are not equal to zero;
    selectively altering feature sizes of each device categorized in each bin in accordance with the tagged sizing adjustment for each bin; and
    wherein the feature sizes are selectively altered by modifying one or more mask layers that define the feature sizes of devices categorized within the bins that are tagged with non-zero sizing adjustments.

2. The method of claim 1, wherein categorizing each device into bins in response to the collected performance metrics comprises:
    establishing a lower deviation magnitude for each bin;
    establishing an upper deviation magnitude for each bin;
    determining an amount of deviation from an acceptable performance level that is exhibited by each device;
    comparing the amount of deviation determined for each device to the established lower and upper deviation magnitudes for each bin; and
    categorizing each device into a bin that exhibits a lower deviation magnitude that is lower than the determined amount of deviation for the device and that exhibits a higher deviation magnitude that is higher than the determined amount of deviation for the device.

3. The method of claim 2, wherein tagging each bin with a sizing adjustment comprises determining a sizing adjustment required to bring each device categorized within each bin into conformance with the acceptable performance level for each device.

4. The method of claim 3, wherein altering feature sizes of each device categorized in each bin in accordance with the tagged sizing adjustment comprises altering a gate length of each device.

5. The method of claim 3, wherein altering feature sizes of each device categorized in each bin in accordance with the tagged sizing adjustment comprises altering a channel width of each device.

6. The method of claim 3, wherein altering feature sizes of each device categorized in each bin in accordance with the tagged sizing adjustment comprises altering both a gate length and a channel width of each device.

7. The method of claim 1, further comprising generating a new semiconductor die that implements the one or more modified mask layers.

8. A design and simulation system, comprising:
a processor adapted to obtain performance improvement within an integrated circuit by selectively altering device features within the integrated circuit by performing functions including,
collecting performance metrics of the devices contained within the integrated circuit, each performance metric being one of a leakage current measurement or a threshold voltage measurement;
wherein each device has a respective individual performance metric value;
categorizing each device into one bin of a plurality of bins in response to the collected performance metrics;
wherein the categorizing includes categorizing all of the devices that have respective individual performance metric values that are within a range of performance metric values into a respective one of the plurality of bins, and the range of the respective individual performance metric values of the devices categorized into each of the plurality of bins does not overlap the range of the respective individual performance metric values of the devices categorized into any other of the plurality of bins;
tagging each bin with a respective sizing adjustment;
wherein the plurality of bins includes at least two bins that are tagged with different respective sizing adjustments that are not equal to zero;
selectively altering feature sizes of each device categorized in each bin in accordance with the tagged sizing adjustment for each bin; and
wherein the feature sizes are selectively altered by modifying one or more mask layers that define the feature sizes of devices categorized within the bins that are tagged with non-zero sizing adjustments.

9. The system of claim 8, wherein categorizing each device into bins in response to the collected performance metrics comprises:
establishing a lower deviation magnitude for each bin;
establishing an upper deviation magnitude for each bin;
determining an amount of deviation from an acceptable performance level that is exhibited by each device;
comparing the amount of deviation determined for each device to the established lower and upper deviation magnitudes for each bin; and
categorizing each device into a bin that exhibits a lower deviation magnitude that is lower than the determined amount of deviation for the device and that exhibits a higher deviation magnitude that is higher than the determined amount of deviation for the device.

10. The system of claim 9, wherein tagging each bin with a sizing adjustment comprises determining a sizing adjustment required to bring each device categorized within each bin into conformance with the acceptable performance level for each device.

11. The system of claim 10, wherein altering feature sizes of each device categorized in each bin in accordance with the tagged sizing adjustment comprises altering a gate length of each device.

12. The system of claim 10, wherein altering feature sizes of each device categorized in each bin in accordance with the tagged sizing adjustment comprises altering a channel width of each device.

13. The system of claim 10, wherein altering feature sizes of each device categorized in each bin in accordance with the tagged sizing adjustment comprises altering both a gate length and a channel width of each device.

14. The system of claim 8, further comprising generating a new integrated circuit that implements the one or more modified mask layers.

15. A method of obtaining performance improvement within an integrated circuit by selective feature sizing of semiconductor devices contained within the integrated circuit, the method comprising:
implementing a first integrated circuit;
collecting performance metrics of the devices contained within the integrated circuit, each performance metric being one of a leakage current measurement or a threshold voltage measurement;
wherein each semiconductor device has a respective individual performance metric value;
categorizing each semiconductor device contained within the first integrated circuit into one bin of a plurality of bins, wherein each bin is tagged with a respective sizing adjustment that is necessary to bring each semiconductor device categorized within the bin into conformance with an acceptable performance level, and the plurality of bins includes at least two bins that are tagged with different respective sizing adjustments that are not equal to zero; and
wherein the categorizing includes categorizing all of the semiconductor devices that have respective performance individual metric values that are within a range of performance metric values into a respective one of the plurality of bins, and the range of the respective individual performance metric values of the devices categorized into each of the plurality of bins does not overlap the range of the respective individual performance metric values of the devices categorized into any other of the plurality of bins:
selectively altering mask layers that define feature sizes of each semiconductor device categorized in each of the plurality of bins in accordance with the tagged sizing adjustment of each bin.

16. The method of claim 15, further comprising implementing a second integrated circuit using the selectively altered mask layers to obtain the performance improvement.

* * * * *